(12) United States Patent
Kwon

(10) Patent No.: US 8,036,047 B2
(45) Date of Patent: Oct. 11, 2011

(54) CIRCUIT AND METHOD FOR GENERATING PUMPING VOLTAGE IN SEMICONDUCTOR MEMORY APPARATUS AND SEMICONDUCTOR MEMORY APPARATUS USING THE SAME

(75) Inventor: Jae-Kwan Kwon, Ichon (KR)

(73) Assignee: Hynix Semiconductor Inc. (KR)

( * ) Notice: Subject to any disclaimer, the term of this patent is extended or adjusted under 35 U.S.C. 154(b) by 473 days.

(21) Appl. No.: 12/340,849

(22) Filed: Dec. 22, 2008

(65) Prior Publication Data

US 2009/0279368 A1 Nov. 12, 2009

(30) Foreign Application Priority Data

May 8, 2008 (KR) .................. 10-2008-0043022

(51) Int. Cl.
*G11C 5/14* (2006.01)

(52) U.S. Cl. .................. 365/189.09; 365/226

(58) Field of Classification Search ............. 365/189.09, 365/226, 227; 327/534–537
See application file for complete search history.

(56) References Cited

U.S. PATENT DOCUMENTS

| | | | | |
|---|---|---|---|---|
| 5,815,446 A | * | 9/1998 | Tobita | 365/189.09 |
| 6,333,873 B1 | | 12/2001 | Kumanoya et al. | |
| 6,608,782 B2 | * | 8/2003 | Hirano | 365/189.09 |
| 6,654,296 B2 | * | 11/2003 | Jang et al. | 365/189.09 |
| 6,853,567 B2 | | 2/2005 | Kwon | |
| 2004/0208026 A1 | | 10/2004 | Kwon | |

FOREIGN PATENT DOCUMENTS

| | | |
|---|---|---|
| JP | 11026697 | 1/1999 |
| KR | 1020010039045 | 5/2001 |
| KR | 1020070038676 | 4/2007 |

\* cited by examiner

*Primary Examiner* — Vu Le
(74) *Attorney, Agent, or Firm* — Baker & McKenzie LLP

(57) ABSTRACT

A circuit for generating a pumping voltage in a semiconductor memory apparatus includes a control signal generation block configured to generate a first control signal obtained by level-shifting a voltage level of a test signal to a first driving voltage level, a voltage application section configured to supply an external voltage to a first node in response to a first transmission signal, a first charge pump configured to raise a voltage level of the first node by a first predetermined level in response to an oscillator signal, and a first pumping voltage output section configured to select at least one of a first connection unit and a second connection unit in response to the first control signal, and to interconnect the first node with a second node using the selected connection unit when a second transmission signal is enabled, wherein a first pumping voltage is output through the second node.

21 Claims, 3 Drawing Sheets

CIRCUIT AND METHOD FOR GENERATING PUMPING VOLTAGE IN SEMICONDUCTOR MEMORY APPARATUS AND SEMICONDUCTOR MEMORY APPARATUS USING THE SAME

CROSS-REFERENCES TO RELATED APPLICATION

The present application claims priority under 35 U.S.C. §119(a) to Korean application number 10-2008-0043022, filed on May 8, 2008, in the Korean Intellectual Property Office, which is incorporated herein by reference in its entirety as set forth in full.

BACKGROUND

1. Technical Field

The embodiments described herein relate to a semiconductor memory apparatus, and more particularly, to a circuit and a method for generating a pumping voltage and a semiconductor memory apparatus using the same.

2. Related Art

In a semiconductor memory apparatus a pumping voltage (VPP) is required when storing or outputting data in order to prevent the loss of a data level. Accordingly, most semiconductor memory apparatuses have a pumping voltage generation circuit and a pumping voltage sensing device.

FIG. 1 is a schematic view of a conventional circuit 1 for generating a pumping voltage in a semiconductor memory apparatus. In FIG. 1, the pumping voltage generation circuit 1 includes first and second capacitors C1 and C2, and first through third transistors N1 through N3.

The first capacitor C1 generates a first boot voltage V_boot1 in response to an oscillator signal 'osc', and the second capacitor C2 generates a second boot voltage V_boot2 in response to an inverted oscillator signal 'oscb'. The first transistor N1 outputs an external voltage VDD to a first node (nodeA) when a first transmission signal 'trans1' is enabled. In general, in a transistor, the level of a voltage that is output from a drain region to a source region changes depending upon the level of the voltage supplied to a gate terminal. Accordingly, the voltage level of the enabled first transmission signal 'trans1' represents a voltage level that allows the external voltage VDD to be most efficiently output to the first node (nodeA) without a voltage drop.

The second transistor N2 outputs the voltage of the first node (nodeA) to a second node (nodeB) when a second transmission signal 'trans2' is enabled. The voltage level of the enabled second transmission signal 'trans2' represents a voltage level that allows the voltage of the first node (nodeA) to be most efficiently output to the second node (nodeB) without a voltage drop.

The third transistor N3 outputs the voltage of the second node (nodeB) as a pumping voltage VPP when a third transmission signal 'trans3' is enabled. The voltage level of the enabled third transmission signal 'trans3' represents a voltage level that allows the voltage of the second node (nodeB) to be most efficiently output as the pumping voltage VPP without a voltage drop. The voltage levels of the enabled first through third transmission signals 'trans1' through 'trans3' are different from one another. The voltage level of the enabled first transmission signal 'trans1' is lowest, and the voltage level of the enabled third transmission signal 'trans3' is highest.

A conventional operation of the pumping voltage generation circuit 1 will be described with reference to FIG. 1.

As the first transmission signal 'trans1' is enabled, the first transistor N1 is turned ON. Since the external voltage VDD is supplied to the first node (nodeA), the voltage level of the first node (nodeA) transitions to the level of the external voltage VDD. When the voltage level of the first node (nodeA) becomes the level of the external voltage VDD, the first transmission signal 'trans1' is disabled, and the first transistor N1 is turned OFF.

The oscillator signal 'osc' swings between the level of the external voltage VDD and a ground level. When the oscillator signal 'osc' transitions to the external voltage VDD, the first capacitor C1 outputs the first boot voltage V_boot1 having the level of the external voltage VDD to the first node (nodeA). Accordingly, the voltage level of the first node (nodeA) is the sum of the first boot voltage 'V_boot1' and the external voltage VDD. In this case, the voltage on node A will be twice the level of the external voltage VDD.

As the second transmission signal 'trans2' is enabled, the second transistor N2 is turned ON, connecting the first node (nodeA) and the second node (nodeB). Thus, the voltage level of the second node (node B) will transition to the level of the voltage on node A.

The inverted oscillator signal 'oscb' also swings between a ground level and the level of the external voltage VDD. When the inverted oscillator signal 'oscb' transitions to the external voltage VDD, the second capacitor C2 outputs the second boot voltage V_boot2 having the level of the external voltage VDD to the second node (nodeB). Accordingly, the voltage level of the second node (nodeB) becomes the sum of the voltage on node A and the second boot voltage 'V_boot2'. In this case, the voltage level on node B will be three times the level of the external voltage VDD.

As the third transmission signal 'trans3' is enabled, the third transistor N3 is turned ON. When the third transistor N3 is turned ON, the voltage of the second node (nodeB) is output as the pumping voltage VPP. Here, the level of the pumping voltage VPP will be three times the level of the external voltage VDD.

In the pumping voltage generation circuit 1, a pumping voltage generation efficiency changes depending upon how efficiently the second transistor N2 and the third transistor N3 transmit the various voltages. Even when the sizes of the transistors are designed to most efficiently transmit the voltages, if the sizes of the transistors change due to process variations, the efficiency of the pumping voltage generation circuit decreases compared to a designed efficiency.

The pumping voltage generation efficiency is defined by the ratio between an amount of current used by the pumping voltage generation circuit and an amount of current used by charge pumps, i.e., the first and second capacitors C1 and C2.

SUMMARY

A circuit and method for generating a pumping voltage in a semiconductor memory apparatus capable of reducing power consumption and a semiconductor memory apparatus using the same are described herein.

In one aspect, a circuit for generating a pumping voltage in a semiconductor memory apparatus comprises a voltage application section configured to supply an external voltage to a first node in response to a first transmission signal, a first charge pump configured to raise a voltage level of the first node by a first predetermined level in response to an oscillator signal, and a first pumping voltage output section comprising a plurality of connection units, each of the plurality of connection units configured to interconnect the first node with a second node when a second transmission signal is enabled.

In another aspect, a method for generating a pumping voltage in a semiconductor memory apparatus includes supplying an external voltage to a first node in response to a first transmission signal, raising a voltage level of the first node by a first predetermined level in response to an oscillator signal, selecting at least one of a first connection unit and a second connection unit in response to a test signal in a test, interconnecting the first node and a second node by the selected connection unit when a second transmission signal is enabled, and fixing one of the first connection unit and the second connection unit through fuse cutting after the test is finished to interconnect the first node and the second node, wherein a first pumping voltage is output through the second node.

In another aspect, a semiconductor memory apparatus includes a pumping voltage generating circuit having a control signal generation block configured to generate a plurality of control signals, each obtained by level-shifting a voltage level of a test signal to one of a first driving voltage level and a second driving voltage level, a voltage application section configured to supply an external voltage to a plurality of nodes in response to a plurality of transmission signals, a plurality of charge pumps, each configured to raise a voltage level of a first node of the plurality of nodes by a first predetermined level in response to an oscillator signal and a second node of the plurality of nodes by a second predetermined level in response to an inverted oscillator signal, and a plurality of pumping voltage output sections, each configured to select at least one of first and second connection units in response to a first control signal of the plurality of control signals to interconnect the first node with the second node using the selected connection unit when a second transmission signal of the plurality of transmission signals is enabled, and to select at least one of third and fourth connection units in response to the second control signal to interconnect the second node and a third node of the plurality of nodes using the selected connection unit when a third transmission signal of the plurality of transmission signals is enabled, wherein one of a first pumping voltage and a second pumping voltage is output through one of the second node and the third node, respectively, to the semiconductor memory apparatus.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
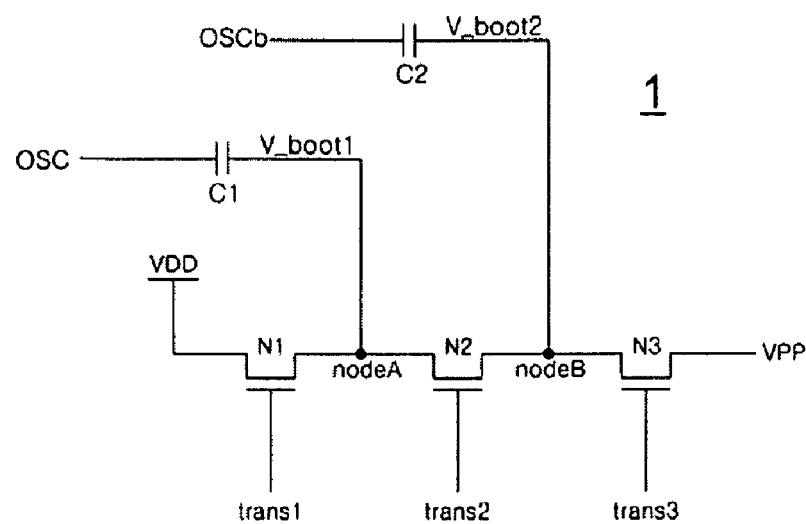
FIG. 1 is a schematic view of a conventional circuit for generating a pumping voltage in a semiconductor memory apparatus.
Figure 2:
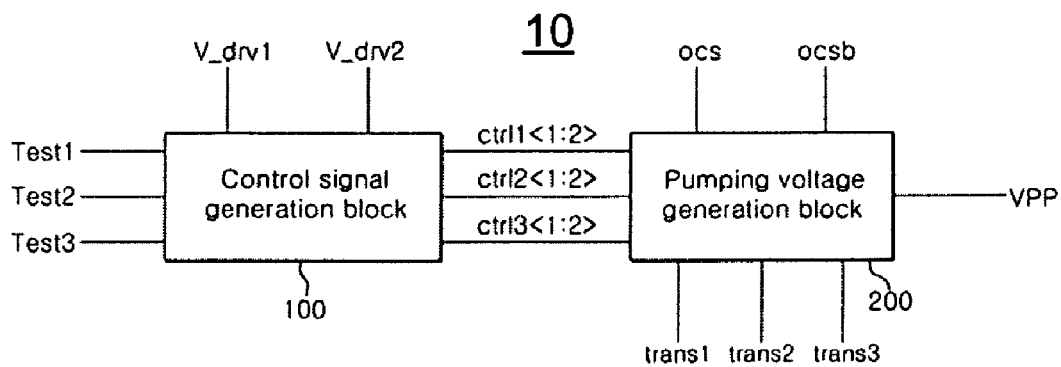
FIG. 2 is a schematic view of an exemplary circuit for generating a pumping voltage in a semiconductor memory apparatus according to one embodiment.

FIG. 2 is a schematic view of an exemplary circuit 10 for generating a pumping voltage in a semiconductor memory apparatus according to one embodiment. In FIG. 2, the exemplary circuit 10 can include a control signal generation block 100 and a pumping voltage generation block 200.

The control signal generation block 100 can be configured to level-shift first through third test signals 'Test1' through 'Test3' using first and second driving voltages V_drv1 and V_drv2, and can generate first through sixth control signals 'ctrl1<1:2>', 'ctrl2<1:2>' and 'ctrl3<1:2>'. For example, the first and second control signals 'ctrl1<1:2>' can be signals that can be respectively obtained by level-shifting the first test signal 'Test1' using the first and second driving voltages V_drv1 and V_drv2. In addition, the third and fourth control signals 'ctrl2<1:2>' can be signals that can be respectively obtained by level-shifting the second test signal 'Test2' using the first and second driving voltages V_drv1 and V_drv2. Moreover, the fifth and sixth control signals 'ctrl3<1:2>' can be signals that can be respectively obtained by level-shifting the third test signal 'Test3' using the first and second driving voltages V_drv1 and V_drv2.

The pumping voltage generation block 200 can be configured to implement pumping operation in response to the first through sixth control signals 'ctrl1<1:2>', 'ctrl2<1:2>' and 'ctrl3<1:2>', first through third transmission signals 'trans1' through 'trans3', and oscillator signals 'osc' and 'oscb', and can generate a pumping voltage VPP as a result of the pumping operation.

Figure 3:
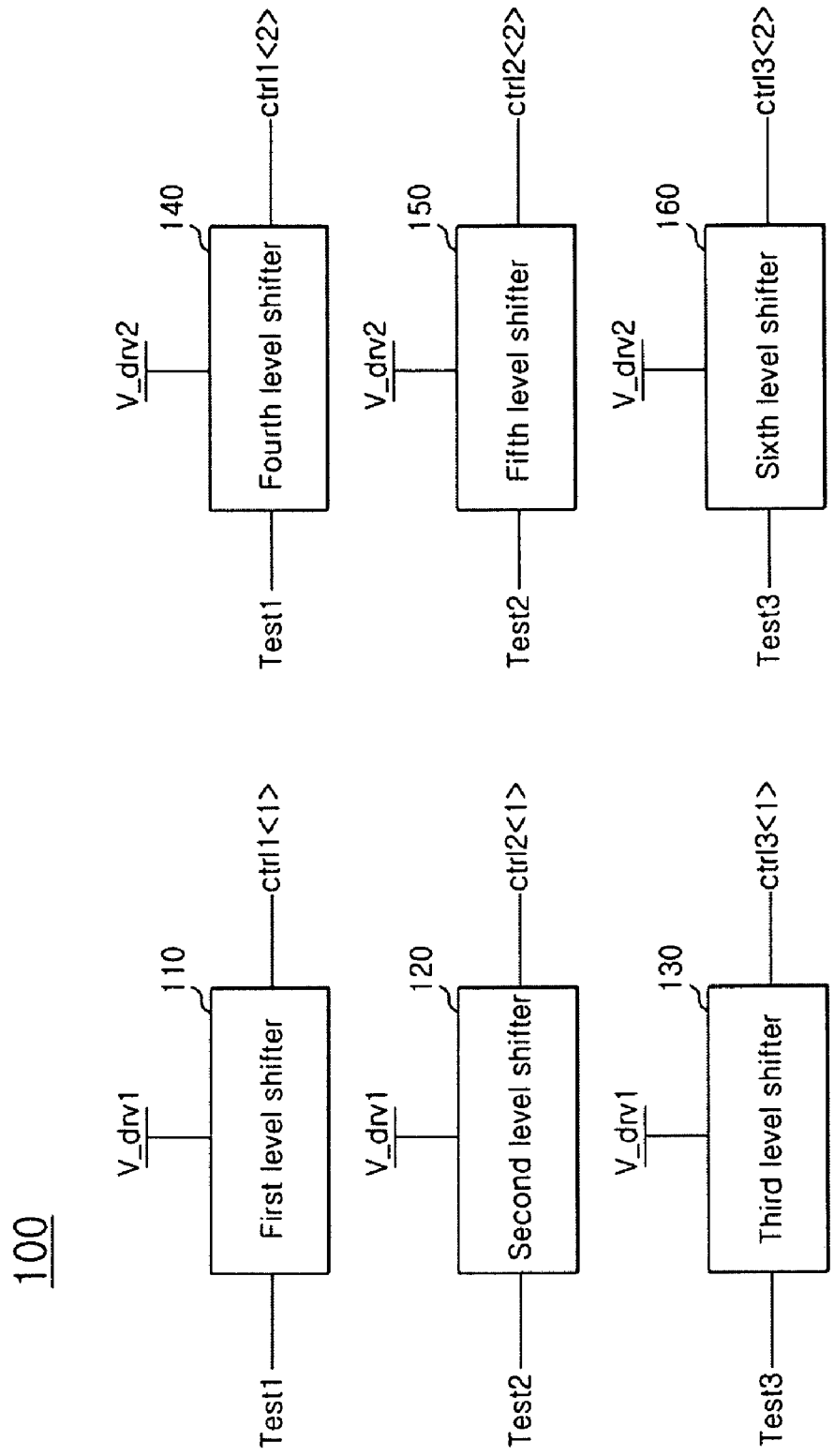
FIG. 3 is a schematic view of a control signal generation block capable of being implemented in the circuit of FIG. 2 according to one embodiment.

FIG. 3 is a schematic view of a control signal generation block 100 capable of being implemented in the circuit of FIG. 2 according to one embodiment. In FIG. 3, the control signal generation block 100 can include first through sixth level shifters 110 through 160.

The first level shifter 110 can level-shift the first test signal 'Test1' using the level of the first driving voltage V_drv1, and can generate the first control signal 'ctrl1<1>'.

The second level shifter 120 can level-shift the second test signal 'Test2' using the level of the first driving voltage V_drv1, and can generate the third control signal 'ctrl2<1>'.

The third level shifter 130 can level-shift the third test signal 'Test3' using the level of the first driving voltage V_drv1, and can generate the fifth control signal 'ctrl3<1>'.

The fourth level shifter 140 can level-shift the first test signal 'Test1' using the level of the second driving voltage V_drv2, and can generate the second control signal 'ctrl1<2>'.

The fifth level shifter 150 can level-shift the second test signal 'Test2' using the level of the second driving voltage V_drv2, and can generate the fourth control signal 'ctrl2<2>'.

The sixth level shifter 160 can level-shift the third test signal 'Test3' using the level of the second driving voltage V_drv2, and can generate the sixth control signal 'ctrl3<2>'.

Here, for example, the level of the second driving voltage V_drv2 can be higher than the level of the first driving voltage V_drv1.

Figure 4:
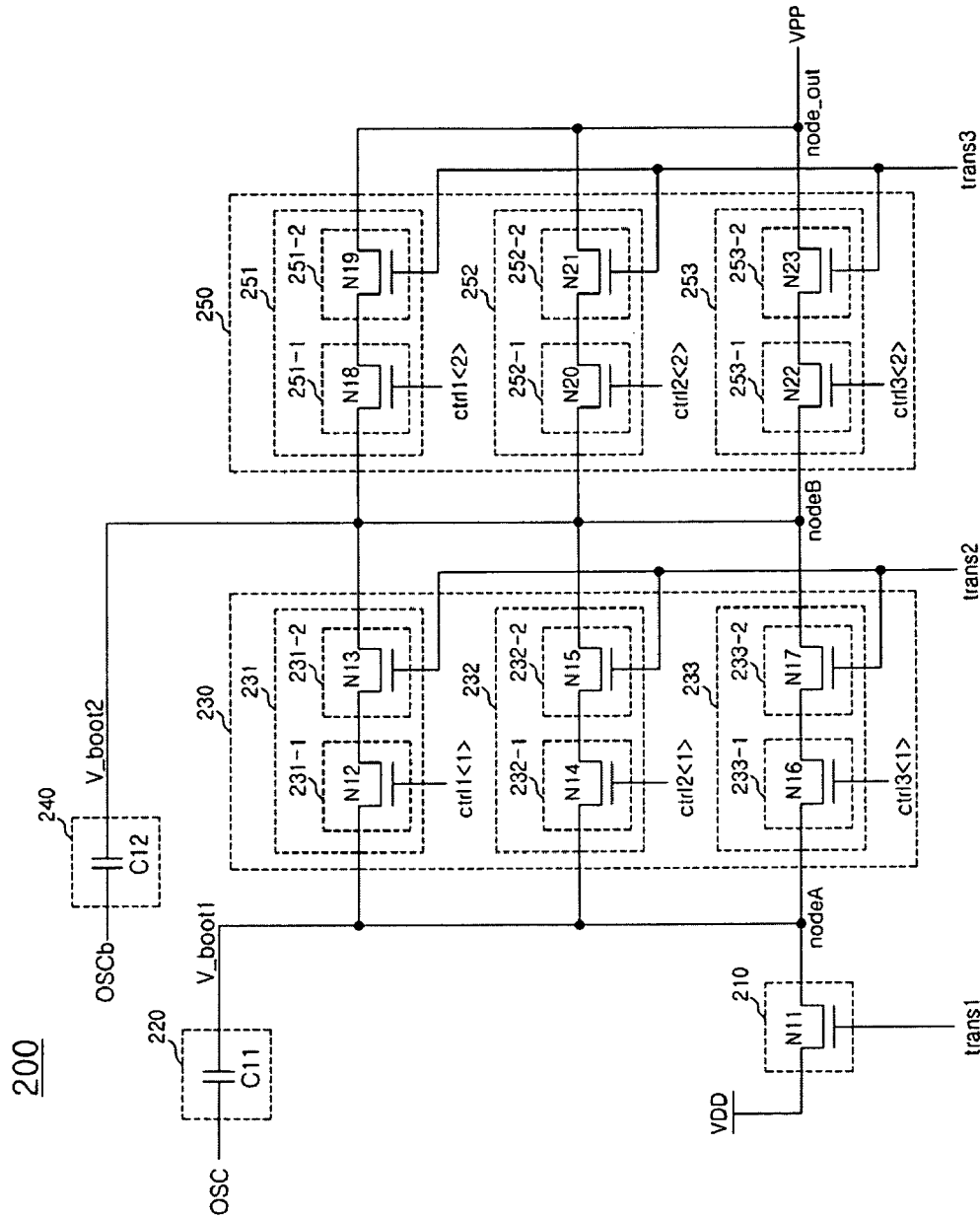
FIG. 4 is a schematic view of a pumping voltage generation block capable of being implemented in the circuit of FIG. 2 according to one embodiment.

FIG. 4 is a schematic view of a pumping voltage generation block 200 capable of being implemented in the circuit of FIG. 2 according to one embodiment. In FIG. 4, the pumping voltage generation block 200 can be configured to include a voltage application section 210, first and second charge pumps 220 and 240, a first pumping voltage output section 230, and a second pumping voltage output section 250.

The voltage application section 210 can supply an external voltage VDD to a first node (nodeA) when the first transmission signal 'trans1' is enabled. For example, the voltage application section 210 can include a first transistor N11 having a gate terminal receiving the first transmission signal 'trans1', a drain terminal receiving the external voltage 'VDD', and a source terminal connected to the first node (nodeA).

The first charge pump 220 can be configured to generate a first boot voltage V_boot1 during the high interval of the oscillator signal 'osc', and can supply the first boot voltage V_boot1 to the first node (nodeA). For example, the first charge pump 220 can include a first capacitor C11 having one terminal receiving the oscillator signal 'osc' and a second terminal connected to the first node (nodeA). Here, for example, the first boot voltage V_boot1 can be output through the other terminal of the first capacitor C11.

In FIG. 4, the first pumping voltage output section 230 can be configured to include first through third connection units 231, 232 and 233.

The first connection unit 231 can be configured to be selected when the first control signal 'ctrl1<1>' is enabled, and can interconnect the first node (nodeA) and a second node (nodeB) when the second transmission signal 'trans2' is enabled. The first connection unit 231 can include a first selection part 231-1 and a first transmission part 231-2.

The first selection part 231-1 can interconnect the first node (nodeA) and the first transmission part 231-2 when the first control signal 'ctrl1<1>' is enabled. For example, the first selection part 231-1 can include a second transistor N12 having a gate terminal receiving the first control signal 'ctrl1<1>', a drain terminal connected to the first node (nodeA), and a source terminal connected to the first transmission part 231-2.

In addition, the first transmission part 231-2 can connect the first selection part 231-1 and the second node (nodeB) when the second transmission signal 'trans2' is enabled. For example, the first transmission part 231-2 can include a third transistor N13 having a gate terminal receiving the second transmission signal 'trans2', a drain terminal connected to the first selection part 231-1, and a source terminal connected to the second node (nodeB).

The second connection unit 232 can be configured to be selected when the third control signal 'ctrl2<1>' is enabled, and can interconnect the first node (nodeA) and the second node (nodeB) when the second transmission signal 'trans2' is enabled. For example, the second connection unit 232 can be configured to include a second selection part 232-1 and a second transmission part 232-2.

The second selection part 232-1 can connect the first node (nodeA) and the second transmission part 232-2 when the third control signal 'ctrl2<1>' is enabled. For example, the second selection part 232-1 can include a fourth transistor N14 having a gate terminal receiving the third control signal 'ctrl2<1>', a drain terminal connected to the first node (nodeA), and a source terminal connected to the second transmission part 232-2.

The second transmission part 232-2 can connect the second selection part 232-1 and the second node (nodeB) when the second transmission signal 'trans2' is enabled. For example, the second transmission part 232-2 can include a fifth transistor N15 having a gate terminal receiving the second transmission signal 'trans2', a drain terminal connected to the second selection part 232-1, and a source terminal connected to the second node (nodeB).

The third connection unit 233 can be configured to be selected when the fifth control signal 'ctrl3<1>' is enabled, and can interconnect the first node (nodeA) and the second node (nodeB) when the second transmission signal 'trans2' is enabled. For example, the third connection unit 233 can include a third selection part 233-1 and a third transmission part 233-2.

In addition, the third selection part 233-1 can connect the first node (nodeA) and the third transmission part 233-2 when the fifth control signal 'ctrl3<1>' is enabled. For example, the third selection part 233-1 can include a sixth transistor N16 having a gate terminal receiving the fifth control signal 'ctrl3<1>', a drain terminal connected to the first node (nodeA), and a source terminal connected to the third transmission part 233-2.

In addition, the third transmission part 233-2 can connect the third selection part 233-1 and the second node (nodeB) when the second transmission signal 'trans2' is enabled. For example, the third transmission part 233-2 can include a seventh transistor N17 having a gate terminal receiving the second transmission signal 'trans2', a drain terminal connected to the third selection part 233-1, and a source terminal connected to the second node (nodeB).

In FIG. 4, the second charge pump 240 can be configured to generate a second boot voltage V_boot2 during the high interval of the inverted oscillator signal 'oscb', and can supply the second boot voltage V_boot2 to the second node (nodeB). For example, the second charge pump 240 can include a second capacitor C12 having one terminal receiving the inverted oscillator signal 'oscb' and a second terminal connected to the second node (nodeB). Here, for example, the second boot voltage V_boot2 can be output through the second terminal of the second capacitor C12.

The second pumping voltage output section 250 can include fourth through sixth connection units 251, 252 and 253.

The fourth connection unit 251 can be configured to be selected when the second control signal 'ctrl1<2>' is enabled, and can connect the second node (nodeB) and an output node (node_out) when the third transmission signal 'trans3' is enabled. For example, the fourth connection unit 251 can include a fourth selection part 251-1 and a fourth transmission part 251-2.

The fourth selection part 251-1 can connect the second node (nodeB) and the fourth transmission part 251-2 when the second control signal 'ctrl1<2>' is enabled. For example, the fourth selection part 251-1 can include an eighth transistor N18 having a gate terminal receiving the second control signal 'ctrl1<2>', a drain terminal connected to the second node (nodeB), and a source terminal connected to the fourth transmission part 251-2.

The fourth transmission part 251-2 can connect the fourth selection part 251-1 and the output node (node_out) when the third transmission signal 'trans3' is enabled. For example, the fourth transmission part 251-2 can include a ninth transistor N19 having a gate terminal receiving the third transmission signal 'trans3', a drain terminal connected to the fourth selection part 251-1, and a source terminal connected to the output node (node_out).

The fifth connection unit 252 can be configured to be selected when the fourth control signal 'ctrl2<2>' is enabled, and can interconnect the second node (nodeB) and the output node (node_out) when the third transmission signal 'trans3' is enabled. For example, the fifth connection unit 252 can include a fifth selection part 252-1 and a fifth transmission part 252-2.

The fifth selection part 252-1 can connect the second node (nodeB) and the fifth transmission part 252-2 when the fourth control signal 'ctrl2<2>' is enabled. For example, the fifth selection part 252-1 can include a tenth transistor N20 having a gate terminal receiving the fourth control signal 'ctrl2<2>', a drain terminal connected to the second node (nodeB), and a source terminal connected to the fifth transmission part 252-2.

The fifth transmission part 252-2 can connect the fifth selection part 252-1 and the output node (node_out) when the third transmission signal 'trans3' is enabled. For example, the fifth transmission part 252-2 can include an eleventh transistor N21 having a gate terminal receiving the third transmission signal 'trans3', a drain terminal connected to the fifth selection part 252-1, and a source terminal connected to the output node (node_out).

The sixth connection unit 253 can be configured to be selected when the sixth control signal 'ctrl3<2>' is enabled, and can interconnect the second node (nodeB) and the output node (node_out) when the third transmission signal 'trans3' is enabled. For example, the sixth connection unit 253 can include a sixth selection part 253-1 and a sixth transmission part 253-2.

The sixth selection part 253-1 can connect the second node (nodeB) and the sixth transmission part 253-2 when the sixth control signal 'ctrl3<2>' is enabled. For example, the sixth selection part 253-1 can include a twelfth transistor N22 having a gate terminal receiving the sixth control signal 'ctrl3<2>', a drain terminal connected to the second node (nodeB), and a source terminal connected to the sixth transmission part 253-2.

The sixth transmission part 253-2 can connect the sixth selection part 253-1 and the output node (node_out) when the third transmission signal 'trans3' is enabled. Here, for example, the pumping voltage VDD can be output through the output node (node_out). For example, the sixth transmission part 253-2 can include a thirteenth transistor N23 having a gate terminal receiving the third transmission signal 'trans3', a drain terminal connected to the sixth selection part 253-1, and a source terminal connected to the output node (node_out).

Accordingly, the level of the first driving voltage V_drv1 can be substantially the same as the voltage level of the enabled second transmission signal 'trans2'. In addition, the level of the second driving voltage V_drv2 can be substantially the same as the voltage level of the enabled third transmission signal 'trans3'. Here, for example, the second driving voltage V_drv2 can have substantially the same level as the first driving voltage V_drv1.

An exemplary operation of the circuit 10 for generating a pumping voltage in a semiconductor memory apparatus will be described with reference to FIGS. 2-4.

The circuit 10 for generating a pumping voltage can be configured such that a node for generating the pumping voltage VPP can be changed in response to the first through third test signals 'Test1' through 'Test3' during a test.

For example, if the first test signal 'Test1' is enabled, then the first node (nodeA) and the second node (nodeB) can be interconnected through the first connection unit 231. In addition, the second node (nodeB) and the output node (node_out) can be interconnected through the fourth connection unit 251.

If the second test signal 'Test2' is enabled, then the first node (nodeA) and the second node (nodeB) can be interconnected through the second connection unit 232. In addition, the second node (nodeB) and the output node (node_out) can be interconnected through the fifth connection unit 252.

If the third test signal 'Test3' is enabled, then the first node (nodeA) and the second node (nodeB) can be interconnected through the third connection unit 233. In addition, the second node (nodeB) and the output node (node_out) can be interconnected through the sixth connection unit 253.

When the first test signal 'Test1' is enabled, an exemplary operation of the circuit 10 for generating a pumping voltage generation circuit for a semiconductor memory apparatus will be explained with reference to FIGS. 2-4.

As the first transmission signal 'trans1' is enabled, the external voltage 'VDD' can be supplied to the first node (nodeA). Accordingly, the voltage of the first node (nodeA) can become the level of the external voltage VDD. Accordingly, when the voltage level of the first node (nodeA) becomes the level of the external voltage VDD, the first transmission signal 'trans1' can be disabled.

The first charge pump 220 can generate the first boot voltage V_boot1 in response to the oscillator signal 'osc' at the timing when the first transmission signal 'trans1' is disabled, and can supply the first boot voltage V_boot1 to the first node (nodeA). Accordingly, the voltage level of the first node (nodeA) can become the summed level of the external voltage VDD and the first boot voltage V_boot1.

Since the first test signal 'Test1' is enabled, if the second transmission signal 'trans2' is enabled, then the first node (nodeA) and the second node (nodeB) can be interconnected through the first connection unit 231. Consequently, if the second transmission signal 'trans2' is enabled, then the second node (nodeB) can have substantially the same voltage level as the first node (nodeA).

If the voltage level of the second node (nodeB) becomes substantially the same as the voltage level of the first node (nodeA), then the second transmission signal 'trans2' can be disabled. In addition, the second charge pump 240 can generate the second boot voltage V_boot2 in response to the inverted oscillator signal 'oscb' at the timing when the second transmission signal 'trans2' is disabled, and can supply the second boot voltage V_boot2 to the second node (nodeB). Accordingly, the voltage level of the second node (nodeB) can become the summed level of the external voltage VDD, the first boot voltage V_boot1, and the second boot voltage V_boot2.

Since the first test signal 'Test1' is in the enabled state, if the third transmission signal 'trans3' is enabled, then the second node (nodeB) and the output node (node_out) can be interconnected through the fourth connection unit 251. Accordingly, the voltage level of the output node (node_out) can become the summed level of the external voltage VDD, the first boot voltage V_boot1, and the second boot voltage V_boot2.

Presuming that the respective levels of the first boot voltage V_boot1 and the second boot voltage V_boot2 are substantially the same as the level of the external voltage VDD, the voltage level of the output node (node_out) can become three times the level of the external voltage VDD. Here, for example, the pumping voltage VPP can be output through the output node (node_out).

In the circuit 10 (in FIG. 2), if the second test signal 'Test2' is enabled, then the pumping voltage VPP can be generated through the second connection unit 232 and the fifth connection unit 252. In addition, if the third test signal 'Test3' is enabled, then the pumping voltage VPP can be generated through the third connection unit 233 and the sixth connection unit 253.

Moreover, the pumping voltage 'VPP' can be generated through the first and second connection units 231 and 232 and the fourth and fifth connection units 251 and 252 by simultaneously enabling the first and second test signals 'Test1' and 'Test2'. Accordingly, in the circuit 10, the pumping voltage 'VPP' can be generated by controlling the number of connection units for interconnecting the first node (nodeA) and the second node (nodeB), and the number of connection units for interconnecting the second node (nodeB) and the output node (node_out).

By performing a test such that the pumping voltage VPP is generated using the transistors N12 through N23 constituting the first through sixth connection units 231 through 233 and 251 through 253, which can be configured to have different sizes, it is possible to find a connection unit that is most efficient in generating the pumping voltage VPP. Accordingly, if the most efficient connection unit is selected, then the level of the corresponding test signal for selecting the connection unit can be fixed through fuse cutting, for example.

Accordingly, in the circuit 10 for generating a pumping voltage in a semiconductor memory apparatus, even when the sizes of transistors are changed due to process variations, it is possible to establish a pumping voltage generation efficiency since a node from which a designed pumping voltage is generated can be selected using test signals. In addition, since a pumping voltage generation efficiency can be maximized irrespective of process variations, power consumption for generating a pumping voltage can be reduced.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A circuit for generating a pumping voltage in a semiconductor memory apparatus, comprising:
    a voltage application section configured to supply an external voltage to a first node in response to a first transmission signal;
    a first charge pump configured to raise a voltage level of the first node by a first predetermined level in response to an oscillator signal; and
    a first pumping voltage output section comprising a plurality of connection units, each of the plurality of connection units configured to interconnect the first node with a second node when a second transmission signal is enabled.

2. The circuit according to claim 1, further comprising a control signal generation block configured to generate a plurality of control signals obtained by level-shifting a voltage level of a plurality of test signals to a plurality of driving voltage levels respectively, wherein the plurality of control signals are used to enable the plurality of connection units.

3. The circuit according to claim 1, wherein a voltage level of the second transmission signal, when enabled, is higher than a voltage level of the first transmission signal, when enabled.

4. The circuit according to claim 2, wherein a first driving voltage level of the plurality of driving voltage levels is substantially the same as a voltage level of the second transmission signal.

5. The circuit according to claim 2, wherein the control signal generation block is configured such that a voltage level of a first control signal that is enabled by level-shifting one of the test signal to a first driving voltage level is substantially the same as the voltage level of the enabled second transmission signal.

6. The circuit according to claim 5, wherein the control signal generation block includes a level shifter that level-shifts the test signal to the first driving voltage level and generates the first control signal.

7. The circuit according to claim 1, wherein each of the plurality of connection units includes:
    a selection part configured to output a voltage of the first node in response to one of the plurality of control signals; and
    a transmission part configured to output an output of the selection part to the second node in response to the second transmission signal.

8. The circuit according to claim 7, wherein the selection part and the transmission part include a plurality of transistors.

9. The circuit according to claim 1, further comprising a second charge pump configured to raise a voltage level of the second node by a second predetermined level in response to an inverted oscillator signal.

10. The circuit of claim 4, further comprising a second pumping voltage output section comprising a second plurality of connection units, each of the plurality of second connection units configured to interconnect the second node and a third node when a third transmission signal is enabled node.

11. The circuit according to claim 10, wherein a second driving voltage level of the plurality of driving voltage levels is higher than the first driving voltage level, and is substantially the same as a voltage level of the enabled third transmission signal.

12. The circuit according to claim 10, wherein each of the second plurality of connection units includes:
    a selection part configured to output a voltage of the second node in response to a second control signal; and
    a transmission part configured to output an output of the selection part to the third node in response to the third transmission signal.

13. The circuit according to claim 12, wherein the selection part and the transmission part include a plurality of transistors.

14. A method for generating a pumping voltage in a semiconductor memory apparatus, comprising:
    supplying an external voltage to a first node in response to a first transmission signal;
    raising a voltage level of the first node by a first predetermined level in response to an oscillator signal;
    selecting at least one of a first connection unit and a second connection unit in response to a test signal in a test;
    interconnecting the first node and a second node by the selected connection unit when a second transmission signal is enabled; and
    fixing one of the first connection unit and the second connection unit through fuse cutting after the test is finished to interconnect the first node and the second node,
    wherein a first pumping voltage is output through the second node.

15. The method according to claim 14, wherein the selecting at least one of a first connection unit and a second connection unit includes level-shifting the test signal to a voltage level of the second transmission signal.

16. The method according to claim 14, further comprising:
    raising a voltage level of the second node by a second predetermined level in response to an inverted oscillator signal;
    selecting at least one of a third connection unit and a fourth connection unit in response to the test signal in the test;
    interconnecting the second node and a third node by the selected connection unit when a third transmission signal is enabled; and
    fixing one of the third connection unit and the fourth connection unit through fuse cutting after the test is finished to interconnect the second node and the third node,
    wherein a second pumping voltage is output through the third node.

17. The method according to claim 16, wherein selecting at least one of a third connection unit and a fourth connection unit includes level-shifting the test signal to a voltage level of the third transmission signal.

18. A semiconductor memory apparatus, comprising:
a pumping voltage generating circuit including:
a control signal generation block configured to generate a plurality of control signals, each obtained by level-shifting a voltage level of a test signal to one of a first driving voltage level and a second driving voltage level;
a voltage application section configured to supply an external voltage to a plurality of nodes in response to a plurality of transmission signals;
a plurality of charge pumps, each configured to raise a voltage level of a first node of the plurality of nodes by a first predetermined level in response to an oscillator signal and a second node of the plurality of nodes by a second predetermined level in response to an inverted oscillator signal; and
a plurality of pumping voltage output sections, each configured to select at least one of first and second connection units in response to a first control signal of the plurality of control signals to interconnect the first node with the second node using the selected connection unit when a second transmission signal of the plurality of transmission signals is enabled, and to select at least one of third and fourth connection units in response to the second control signal to interconnect the second node and a third node of the plurality of nodes using the selected connection unit when a third transmission signal of the plurality of transmission signals is enabled,
wherein one of a first pumping voltage and a second pumping voltage is output through one of the second node and the third node, respectively, to the semiconductor memory apparatus.

19. The semiconductor memory apparatus according to claim 18, wherein a voltage level of the enabled second transmission signal is higher than a voltage level of the enabled first transmission signal.

20. The semiconductor memory apparatus according to claim 18, wherein the first driving voltage level is substantially the same as a voltage level of the second transmission signal.

21. The semiconductor memory apparatus according to claim 18, wherein the second driving voltage level is higher than the first driving voltage level, and is substantially the same as a voltage level of the enabled third transmission signal.

* * * * *